United States Patent [19]
Takagi et al.

[11] Patent Number: 5,357,662
[45] Date of Patent: Oct. 25, 1994

[54] METHOD OF MANUFACTURING CHIP-TYPE PIEZOELECTRIC-RESONATOR

[75] Inventors: Ryoji Takagi; Yoshiharu Kuroda, both of Kyoto, Japan

[73] Assignee: Murata Manufacturing Co., Ltd., Japan

[21] Appl. No.: 122,233

[22] Filed: Sep. 15, 1993

[30] Foreign Application Priority Data

Sep. 16, 1992 [JP] Japan ................... 4-246727

[51] Int. Cl.$^5$ ............................................. H01L 41/22
[52] U.S. Cl. ............................ 29/25.35; 29/856; 310/323; 310/340; 310/365
[58] Field of Search ............... 29/25.35, 854–856; 310/321–323, 325, 340, 365

[56] References Cited

U.S. PATENT DOCUMENTS 4,757,581  7/1988  Yamada et al. ............ 29/25.35
5,121,024  6/1992  Seto ....................... 29/25.35 X

*Primary Examiner*—Carl E. Hall
*Attorney, Agent, or Firm*—Ostrolenk, Faber, Gerb & Soffen

[57] ABSTRACT

In order to improve reliability in electrical connection between internal terminal electrodes and external electrodes in a chip-type piezoelectric-resonator which, protected with resin so as to be capable of surface mounting, a mother substrate is prepared comprising a piezoelectric substrate and a plurality of piezoelectric resonance elements formed thereon. Thick-film electrodes are formed so as to cover the terminal electrodes of the respective piezoelectric resonance elements. Thermosetting protective resin members are applied to cover both major surfaces of the mother substrate, which in turn is divided into individual piezoelectric resonance elements so that the thick-film electrodes are exposed on divided surfaces formed by dividing step. External electrodes are formed on the divided surfaces.

5 Claims, 6 Drawing Sheets

METHOD OF MANUFACTURING CHIP-TYPE PIEZOELECTRIC-RESONATOR

BACKGROUND OF THE INVENTION

1. Field of the Invention

The present invention relates to a method of manufacturing a chip-type piezoelectric-resonator, in particular, a chip-type piezoelectric resonator which is applied to for example a chip-type filter, oscillator, or discriminator.

2. Description of the Background Art

In general, a piezoelectric-resonator, which is applied to a filter, an oscillator or a discriminator, is provided with lead wires.

In recent years, however, a surface mounting technique has been employed in order to miniaturize an electronic device, leading to a requirement for a chip-type piezoelectric-resonator having no lead wires. A concrete example of such a chip-type piezoelectric-resonator is now described with reference to FIGS. 10 to 12.

As shown in FIGS. 10 to 12, a piezoelectric-resonator 1 comprises a piezoelectric substrate 2. Split vibrating electrodes 3 and 4 are formed on one major surface of the piezoelectric substrate 2, while still another vibrating electrode 5 is formed on another major surface of the substrate 2 so as to be opposite to the vibrating electrodes 3 and 4. These vibrating electrodes 3, 4 and 5 are respectively connected with terminal electrodes 6, 7 and 8, which are located on an edge of the piezoelectric substrate 2.

This piezoelectric-resonator 1 implements an energy trapping type double mode piezoelectric-resonator utilizing a thickness vibration mode having the split vibrating electrodes 3 and 4 and the vibrating electrode 5 which is opposite thereto. Resin plates 11 and 12 of polyphenylene sulfide (PPS), having cavities 9 and 10 in portions corresponding to the vibrating electrodes 3 to 5 respectively, are arranged on both surfaces of the piezoelectric substrate 2, and fixed to the piezoelectric substrate 2 by adhesives 13 and 14 (shown in FIG. 11). As shown in FIG. 12, external electrodes 15, 16 and 17 are formed on an outer surface of the piezoelectric-resonator 1, so as to be electrically connected with the terminal electrodes 6, 7 and 8 respectively.

Such a chip-type piezoelectric-resonator 1 is advantageously miniaturized, so as to enable surface mounting.

However, although the resin plates 11 and 12 are bonded to the piezoelectric substrate 2 by the adhesives 13 and 14, the adhesive strength is relatively weak and hence it is difficult to prevent undesired vibration in a portion other than the vibrating portion of the piezoelectric-resonator 1 for suppressing a spurious response.

Further, employment of the adhesives 13 and 14 may cause permeation of water through interfaces between the piezoelectric substrate 2 and the resin plate 11 and 12, leading to inferiority in moisture resistance.

In addition, the sectional areas of portions of the terminal electrodes 6, 7 and 8, which are exposed on the end surface of the piezoelectric substrate 1, are so small that high reliability cannot be attained in electrical connection between the terminal electrodes 6, 7 and 8 and the external electrodes 15, 16 and 17, respectively.

SUMMARY OF THE INVENTION

Accordingly, an object of the present invention is to provide a method of manufacturing a chip-type piezoelectric-resonator which can solve the aforementioned problems.

The inventive method includes preparing a mother substrate comprising a piezoelectric substrate and a plurality of piezoelectric resonance elements formed on the piezoelectric substrate. The piezoelectric resonance elements include vibrating electrodes which are opposite to each other through the piezoelectric substrate and terminal electrodes which are connected to the respective vibrating electrodes. Metal paste is applied onto the mother substrate to form thick-film electrodes at least partially covering the respective terminal electrodes. Then, thermosetting protective resin members are applied and cover both major surfaces of such a mother substrate. The mother substrate which is covered with the protective resin members is divided into independent piezoelectric resonance elements so as to expose sections of the thick-film electrodes on the divided surfaces. External electrodes are formed on the divided surfaces to be connected with the thick-film electrodes.

According to the present invention, the thermosetting protective resin members are applied so as to cover both major surfaces of the mother substrate so that high adhesion strength is attained between the protective resin members and the mother substrate without employment of adhesives. Thus, it is possible to sufficiently suppress undesired vibration in a portion other than the vibrating portion of the piezoelectric-resonator, as well as to improve moisture resistance of the piezoelectric-resonator.

Furthermore, according to the present invention, the mother substrate, which is covered with the protective resin members, is finally divided so as to obtain a plurality of chip-type piezoelectric-resonators, whereby it is possible to efficiently obtain a number of chip-type piezoelectric-resonators.

According to the present invention, the thick-film electrodes are formed independently of the original terminal electrodes so that sections of the thick-film electrodes are exposed on the divided surfaces. The external electrodes are formed so as to be connected with the thick-film electrodes which are located on the divided surfaces, whereby reliability is improved in the electrical connection between the external electrodes and the terminal electrodes.

The foregoing and other objects, features, aspects and advantages of the present invention will become more apparent from the following detailed description of the preferred embodiments of the present invention when taken in conjunction with the accompanying drawings.

DESCRIPTION OF THE PREFERRED EMBODIMENTS

Figure 1:
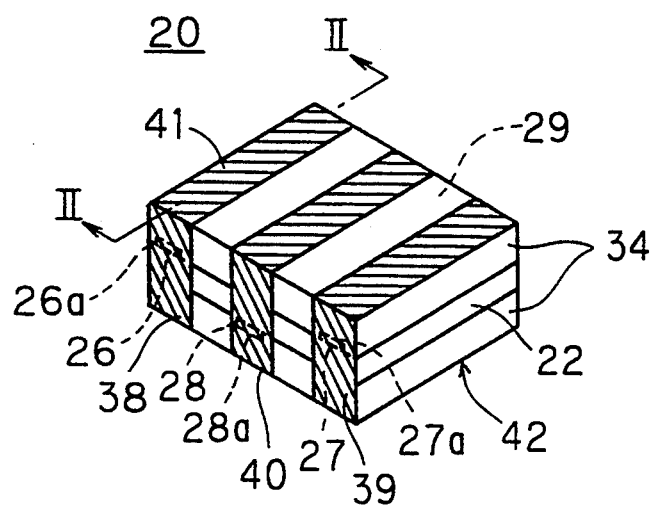
FIG. 1 is a perspective view showing the appearance of a chip-type piezoelectric-resonator 20 obtained according to an embodiment of the present invention.
Figure 2:
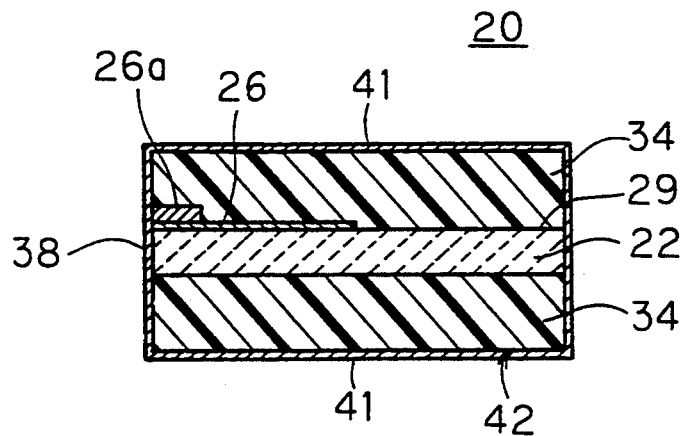
FIG. 2 is a sectional view taken along the line II—II in FIG. 1.

FIG. 1 a chip-type piezoelectric-resonator 20 which is obtained by a method according to an embodiment of the present invention. FIG. 2 is a sectional view taken along the line II—II in FIG. 1. Such a piezoelectric-resonator 20 is obtained through the steps shown in FIGS. 3 to 9.

Figure 3:
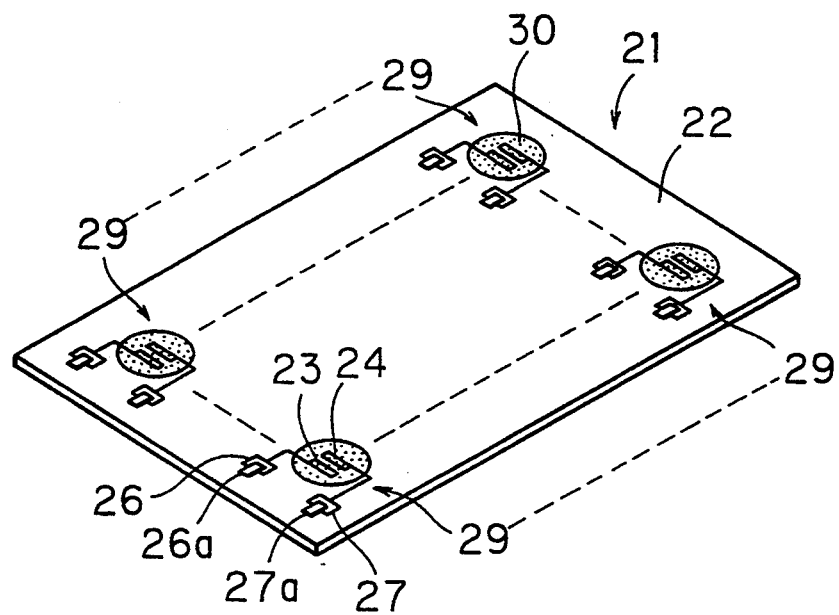
FIG. 3 is a perspective view showing a mother substrate 21 which is prepared for obtaining the chip-type piezoelectric-resonator 20 shown in FIG. 1.
Figure 4:
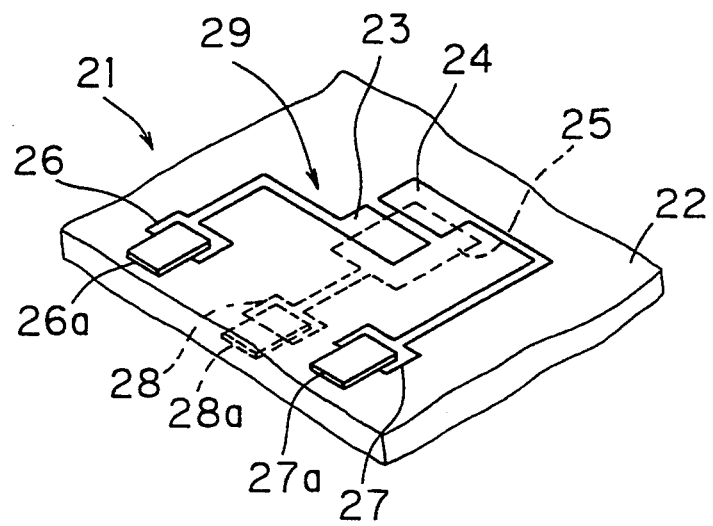
FIG. 4 is a perspective view showing in an enlarged manner a part of the mother substrate 21 shown in FIG. 3.

First, a mother substrate 21 is prepared as shown in FIG. 3. FIG. 4 shows in an enlarged manner a part of this mother substrate 21. The mother substrate 21 comprises a piezoelectric substrate 22 of a piezoelectric ceramic material, which is provided with split vibrating electrodes 23 and 24 formed on one major surface thereof and yet another vibrating electrode 25 formed on another major surface so as to be opposite to the vibrating electrodes 23 and 24. Terminal electrodes 26, 27 and 28 are connected to the vibrating electrodes 23, 24 and 25, respectively. Each combination of the vibrating electrodes 23 to 25 and the terminal electrodes 26 to 28 respectively defines a single piezoelectric resonance element 29, so that the mother substrate 21 provides a plurality of such piezoelectric resonance elements 29.

Each piezoelectric resonance element 29 implements an energy trapping double mode piezoelectric-resonator utilizing a thickness vibration mode, which has the split vibrating electrodes 23 and 24 and the vibrating electrode 25 being positioned opposite thereto. In order to ensure vibrating spaces for the respective vibrating electrodes, cavity forming materials 30 of wax, for example, are applied to the piezoelectric resonance elements 29.

The structure and the type of each piezoelectric resonance element 29 which is formed on the mother substrate 21 can be arbitrarily selected. For example, such a piezoelectric resonance element may implement an energy trapping element utilizing a thickness shear vibration mode. In this case, a rubber-type elastic member such as a silicone rubber member may be applied around its vibrating electrodes, in order to provide a proper damping effect.

As shown in FIGS. 3 and 4, thick-film electrodes 26a, 27a and 28a are formed so as to at least partially cover the terminal electrodes 26, 27 and 28, respectively. These thick-film electrodes 26a to 28a are applied by printing metal paste containing a metal such as copper or silver, for example. While the terminal electrodes 26 to 28 are about 1 μm in thickness, the thick-film electrodes 26a to 28a are 30 to 50 μm in thickness.

Figure 5:
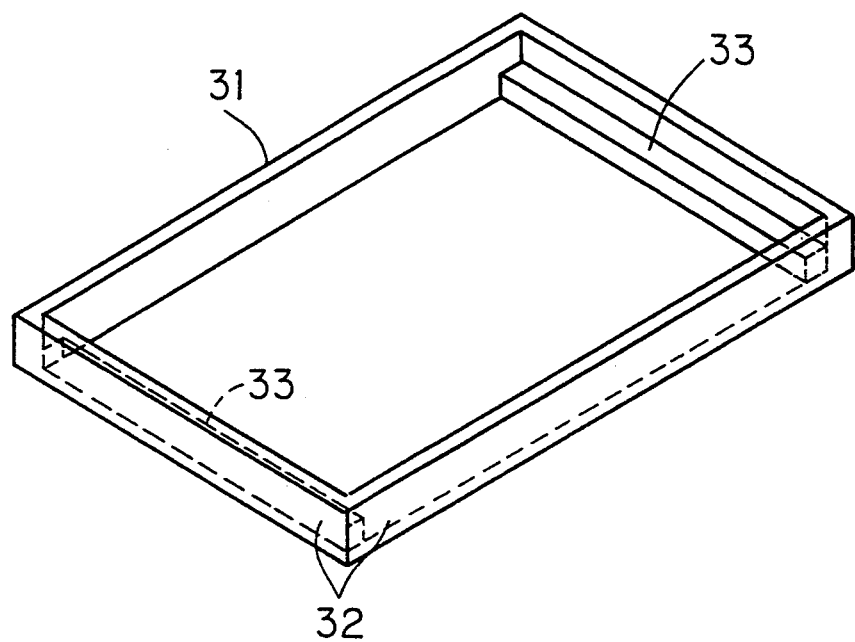
FIG. 5 is a perspective view showing a frame 31 which is employed for obtaining the chip-type piezoelectric-resonator 20 shown in FIG. 1.

A frame 31 of resin, for example, is prepared so that the aforementioned mother substrate 21 can be substantially tightly fitted thereinto, as shown in FIG. 5. The frame 31 is prepared so that the frame 21 is neither deformed nor melted by a temperature of about 150° C., for example, for heating and hardening a protective resin as described later. Outer side surfaces 32 of the frame 31 are preferably made so that the side surfaces 32 have improved planar surfaces, if the side surfaces 32 are to be used as reference planes in cutting as described later.

Further, the frame 31 is preferably provided with means capable of fixing the mother substrate 21 received therein substantially at a central portion along the direction of its thickness. According to this embodiment, shelves or project 33 are provided on opposite inner surfaces, such as the shorter inner side surfaces, for example, of the frame 31.

Figure 6:
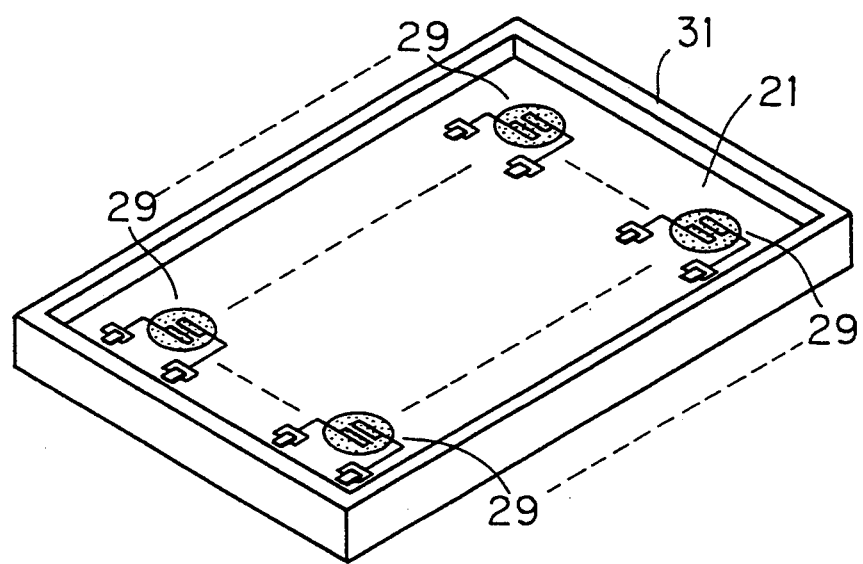
FIG. 6 is a perspective view showing the mother substrate 21, shown in FIG. 2, which is fitted into the frame 31 appearing in FIG. 5.
Figure 7:
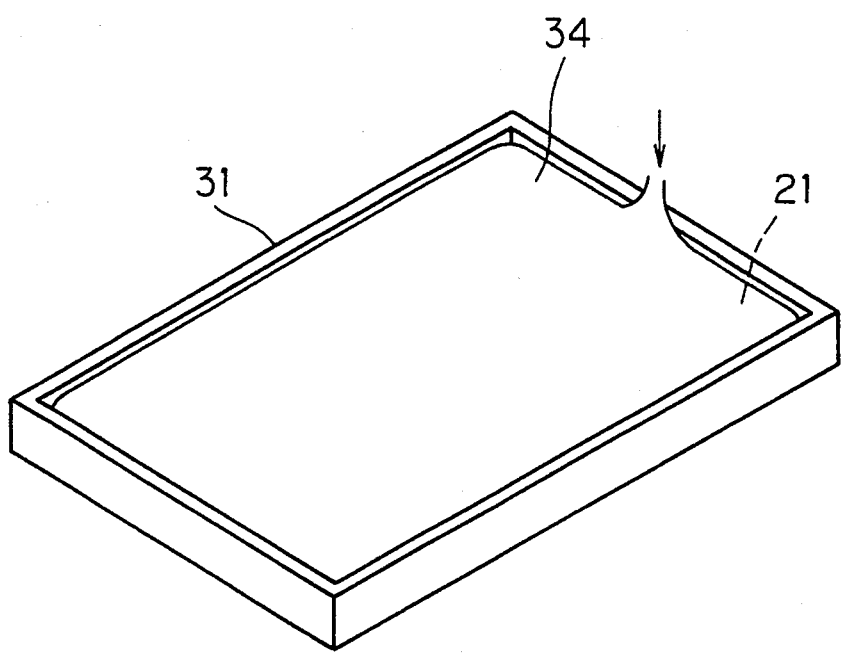
FIG. 7 is a perspective view showing a state in which protective resin 34 is introduced onto the mother substrate 21 shown in FIG. 6.

The mother substrate 21 is fitted into the frame 31 as shown in FIG. 6, and unhardened protective resin 34 is introduced onto one surface of the mother substrate 21, as shogun in FIG. 7. This protective resin 34 is prepared from epoxy-system thermosetting resin which is liquefied with a solvent, for example, with addition of a proper amount of filler such as silica or talc, for example. The protective resin 34 is dried at room temperature, for example, so as not to flow out upon reversal or inversion of the frame 31 with the mother substrate 21, and thereafter the frame 31 is reversed or inverted with the mother substrate 21 and the protective resin 34 so that another protective resin 34 is introduced onto the other surface of the mother substrate 21. This protective resin 34 is also dried at room temperature, for example.

Then, the protective resin members 34, which are introduced in two stages as described above, are heated and hardened at 150° C. for 30 minutes, for example. At this time, the cavity forming materials 30 migrate into the protective resin materials 34, thereby defining cavities that provide vibrating spaces for the respective vibrating electrodes. The thick-film electrodes 26a to 28a are baked.

The, outer surfaces of the respective protective resin members 34 are polished with the frame 31, in order to improve the dimensional accuracy along the direction of thickness and the flatness of the surfaces of each chip-type piezoelectric-resonator 20 (see FIGS. 1 and 2) that is to be obtained. Such polishing is carried out by lapping with a polishing plate, for example. As a result a sandwich structure 35 of the mother substrate 21 and the protective resin members 34 covering both surfaces thereof is obtained, as shown in FIG. 8.

Figure 8:
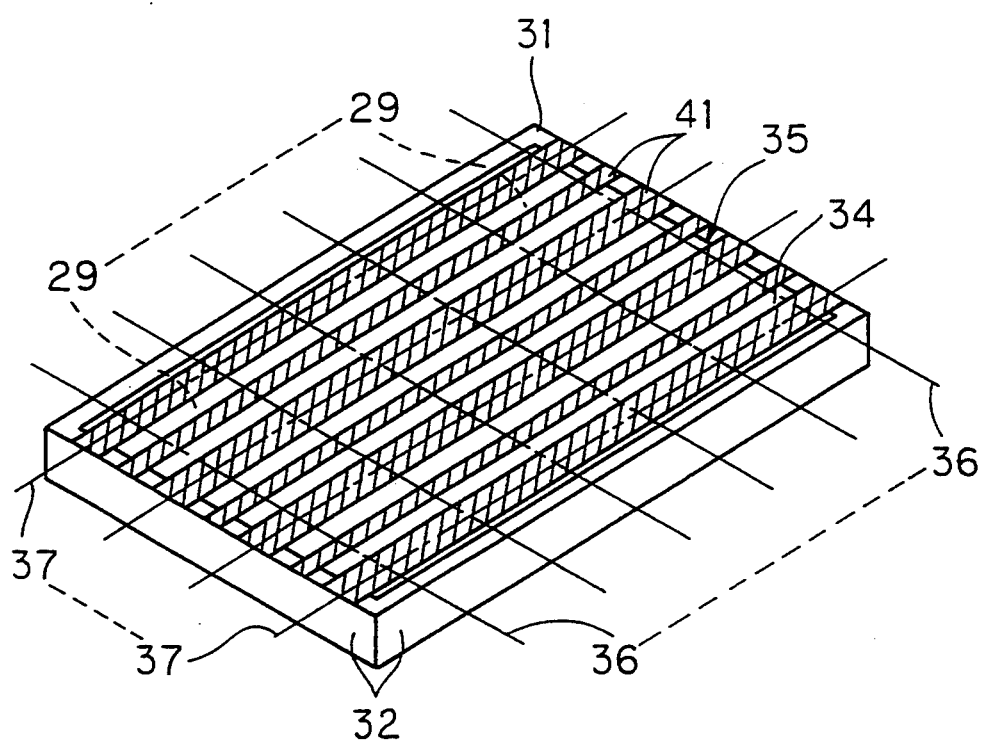
FIG. 8 is a perspective view for illustrating a step of cutting a sandwich structure 35 which is obtained after hardening of the protective resin 34 shown in FIG. 7.

Then, conductive films 41 are formed on both the surfaces of the sandwich structure 35 for defining parts of external electrodes as described later, also as shown in FIG. 8. These conductive films 41 are formed by printing metal paste containing copper or silver, for example, and baking the paste. Although the conductive films 41 are formed also on the frame 31 in FIG. 8, such conductive films 41 may alternatively be formed only on the protective resin members 34.

As shown in FIG. 8, further, this sandwich structure 35 is cut with the frame 31 along cutting lines 36 and 37 through the use of the reference planes defined by the outer side surfaces 32 of the frame 31. Thus, the mother substrate 31 is divided into individual piezoelectric resonance elements 29, to provide each chip 42 shown in FIG. 9. Respective sections of the thick-film electrodes 26a to 28a and the terminal electrodes 26 to 28 are exposed on cut surfaces that are exposed by cutting the sandwich structure 35, i.e., a divided surface of this chip 42. Alternatively, only the thick-film electrodes 26a to 28a may be exposed on a such a divided surface. Further, the aforementioned polishing and cutting steps may be carried out after the sandwich structure 35 is taken out from the frame 31.

Figure 9:
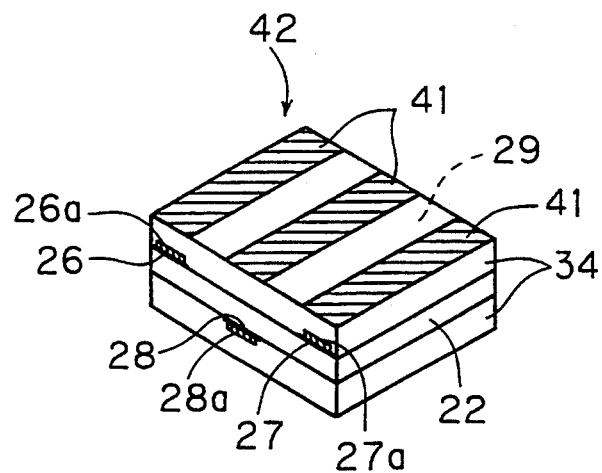
FIG. 9 is a perspective view showing a chip 42 which is obtained through the cutting step shown in FIG. 8.
Figure 10:
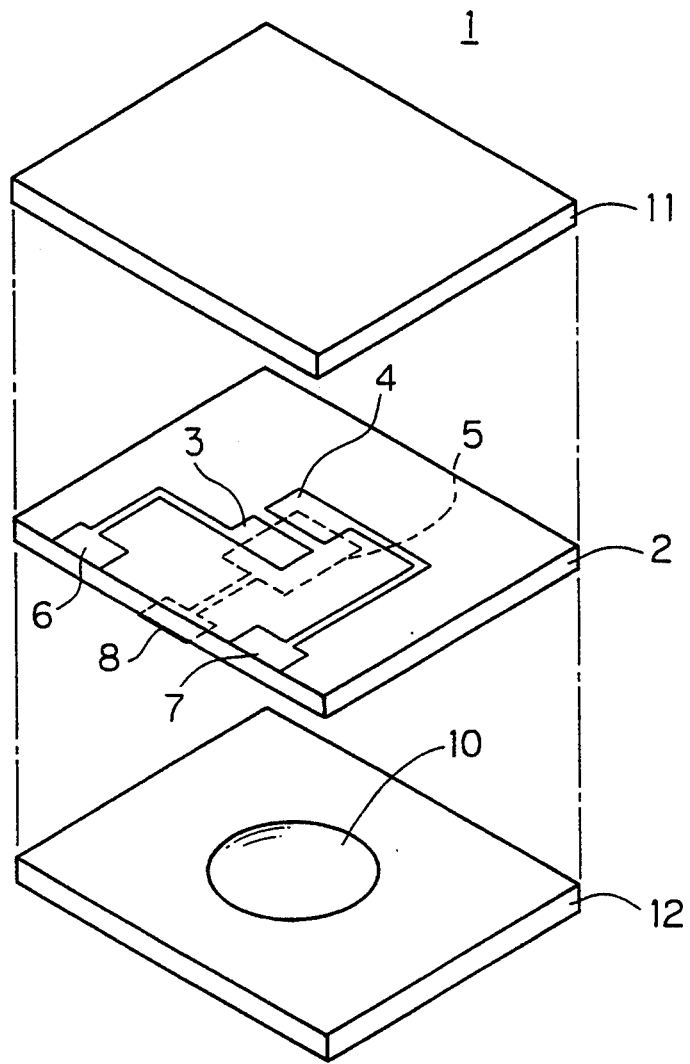
FIG. 10 is a perspective view showing in an exploded manner elements included in a conventional chip-type piezoelectric-resonator 1.
Figure 11:
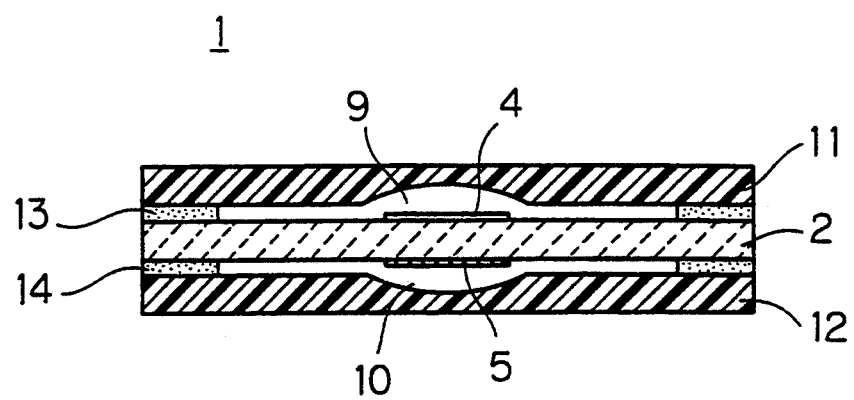
FIG. 11 is a sectional view of the chip-type piezoelectric-resonator 1 shown in FIG. 10.
Figure 12:
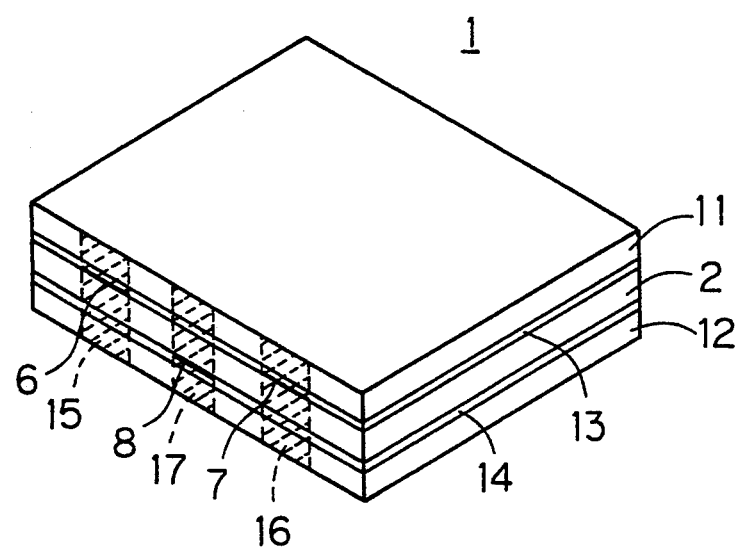
FIG. 12 is a perspective view showing the appearance of the chip-type piezoelectric-resonator 1 shown in FIG. 10.

Then, conductive films are formed on at least the divided surface of the chip 42 shown in FIG. 9 exposing the thick-film electrodes 26a to 28a and the terminal electrodes 26 to 28 as shown in FIGS. 1 and 2 by printing and baking of metal paste, for example, thereby providing external electrodes 38 to 40 partially formed by the conductive films 41. As is clearly understood from FIG. 2, the external electrodes 38 to 40 enclose the outer periphery of the chip 42.

In the chip-type piezoelectric-resonator 20, the external electrodes 38 to 40 are in contact not only with the terminal electrodes 26 to 28 but also with corresponding ones of the thick-film electrodes 26a to 28a as is clearly understood from FIG. 2, so as to implement highly reliable electrical connection.

Although the conductive films are formed on the divided surface exposing the thick-film electrodes 26a to 28a after the chip 42 shown in FIG. 9 is obtained in the aforementioned embodiment, such conductive films may alternatively be formed when the mother substrate 21 is cut along the cutting lines 36, but has not as yet been cut along the cutting lines 37 shown in FIG. 8.

Although the preferred embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a chip-type piezoelectric-resonator, comprising the steps of:

preparing a mother substrate having a piezoelectric substrate and a plurality of piezoelectric resonance elements, each piezoelectric resonance element including corresponding vibration electrodes that are arranged on said piezoelectric substrate so as to be opposite to each other through said piezoelectric substrate, and respective terminal electrodes that are connected with said vibrating electrodes;

applying metal paste onto said mother substrate to form thick-film electrodes covering at least parts of said terminal electrodes;

forming thermosetting protective resin members to cover both major surfaces of said mother substrate;

dividing said mother substrate covered with said protective resin members to obtain respective ones of said plurality of piezoelectric resonance elements thereby exposing sections of said thick-film electrodes on divided surfaces formed on said respective ones of said resonance elements by the dividing step; and forming external electrodes on said divided surfaces so as to be connected with said thick-film electrodes, thereby obtaining a plurality of chip-type piezoelectric resonators.

2. A method of manufacturing a chip-type piezoelectric-resonator in accordance with claim 1, wherein said thick-film electrodes are 30 to 50 μm in thickness.

3. A method of manufacturing a chip-type piezoelectric-resonator in accordance with claim 1, wherein the step of forming protective resin members comprises the steps of:

preparing a frame for enclosing said mother substrate along its periphery;

arranging said mother substrate in said frame so as to form protective resin member forming cavities on said both major surfaces of said mother substrate, respectively, said both major surfaces serving as bottom surfaces of said cavities, respectively;

introducing said protective resin members into said cavities in unhardened states, respectively;

and then hardening said protective resin members so as to form said protective resin members.

4. A method of manufacturing a chip-type piezoelectric-resonator in accordance with claim 3, further comprising the step of polishing outer surfaces of said protective resin members with said frame in advance of the step of dividing said mother substrate.

5. A method of manufacturing a chip-type piezoelectric-resonator in accordance with claim 3, wherein the step of dividing said mother substrate comprises the step of cutting said mother substrate that is covered with said protective resin members while said mother substrate is retained by said frame.

* * * * *